(12) United States Patent
Sinha

(10) Patent No.: US 7,951,414 B2
(45) Date of Patent: May 31, 2011

(54) METHODS OF FORMING ELECTRICALLY CONDUCTIVE STRUCTURES

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 355 days.

(21) Appl. No.: 12/052,039

(22) Filed: Mar. 20, 2008

(65) Prior Publication Data

US 2009/0238958 A1 Sep. 24, 2009

(51) Int. Cl.
*B05D 5/12* (2006.01)

(52) U.S. Cl. .................... 427/98.1; 427/97.3; 427/97.4; 427/97.9; 205/67

(58) Field of Classification Search ............. 427/97.3, 427/97.4, 97.9, 99.5, 58; 205/67
See application file for complete search history.

(56) References Cited

U.S. PATENT DOCUMENTS

| | | | |
|---|---|---|---|
| 6,355,153 B1 * | 3/2002 | Uzoh et al. ............ 205/87 |
| 6,376,361 B1 | 4/2002 | Chooi et al. |
| 6,849,541 B1 | 2/2005 | Hu et al. |
| 6,930,034 B2 | 8/2005 | Colburn et al. |
| 7,074,721 B2 | 7/2006 | Wang |
| 7,129,164 B2 | 10/2006 | Chang et al. |
| 7,157,795 B1 | 1/2007 | Erb et al. |
| 7,169,700 B2 | 1/2007 | Chang et al. |
| 7,214,614 B2 | 5/2007 | Chopra |
| 7,307,016 B1 | 12/2007 | Guo |
| 2001/0051431 A1 | 12/2001 | Chadda et al. |
| 2002/0112954 A1 * | 8/2002 | Evans .............. 204/297.1 |
| 2002/0148733 A1 * | 10/2002 | Saito et al. ............ 205/126 |
| 2003/0134508 A1 | 7/2003 | Raaijmakers et al. |
| 2003/0219976 A1 * | 11/2003 | Gleason .............. 438/678 |
| 2004/0219783 A1 | 11/2004 | Ahn et al. |
| 2005/0003737 A1 * | 1/2005 | Montierth et al. ........... 451/5 |
| 2005/0045485 A1 | 3/2005 | Shih et al. |
| 2006/0046456 A1 | 3/2006 | An |
| 2006/0057842 A1 | 3/2006 | Wang |
| 2006/0091551 A1 | 5/2006 | Lin et al. |
| 2006/0166484 A1 | 7/2006 | Ishikawa |

(Continued)

FOREIGN PATENT DOCUMENTS

SG  137644  12/2007

(Continued)

OTHER PUBLICATIONS

Product Brochure "High Density Interconnect & Wafer Level Packaging" 6 pages http://www.izm.fraunhofer.de/fhg/Images/hdi_wlp_en_tcm357-91809.pdf.

(Continued)

*Primary Examiner* — Michael Kornakov
*Assistant Examiner* — Austin Murata
(74) *Attorney, Agent, or Firm* — Wells St. John P.S.

(57) ABSTRACT

Some embodiments include methods of forming conductive material within high aspect ratio openings and low aspect ratio openings. Initially, the high aspect ratio openings may be filled with a first conductive material while the low aspect ratio openings are only partially filled with the first conductive material. Additional material may then be selectively plated over the first conductive material within the low aspect ratio openings relative to the first conductive material within the high aspect ratio openings. In some embodiments, the additional material may be activation material that only partially fills the low aspect ratio opening, and another conductive material may be subsequently plated onto the activation material to fill the low aspect ratio openings.

12 Claims, 13 Drawing Sheets

U.S. PATENT DOCUMENTS

| | | |
|---|---|---|
| 2006/0258144 A1 | 11/2006 | Choi et al. |
| 2007/0096321 A1 | 5/2007 | Raaijmakers et al. |
| 2007/0155145 A1 | 7/2007 | Hong |
| 2007/0155170 A1 | 7/2007 | Jang |
| 2007/0205515 A1 | 9/2007 | Agarwala et al. |
| 2007/0222068 A1 | 9/2007 | Yamada |
| 2007/0275557 A1 | 11/2007 | Yang et al. |
| 2007/0298604 A1 | 12/2007 | Liu et al. |
| 2008/0012133 A1 | 1/2008 | Shih et al. |
| 2008/0026566 A1 | 1/2008 | Gambino et al. |
| 2008/0026570 A1 | 1/2008 | Kim et al. |
| 2009/0277867 A1* | 11/2009 | Mayer et al. .............. 216/13 |

FOREIGN PATENT DOCUMENTS

| | | |
|---|---|---|
| TW | 265572 | 11/2006 |
| TW | 278968 | 4/2007 |
| TW | 282602 | 6/2007 |
| WO | WO2007034391 A2 | 3/2007 |

OTHER PUBLICATIONS

Burghartz, Joachim N. "Saddle Add-On Metallization for RF-IC Technology" IEEE Transactions on Electron Devices, vol. 51., No. 3 Mar. 2004 pp. 460-466.

Ohoka, Y., et al. "Integration of High Performance and Low Cost Cu/Ultra Low-k SiOC(k-2.0) Interconnects with Self-formed Barrier Technology for 32nm-node and Beyond" IEEE, Mar. 2007, pp. 67-69.

Yoon, Seung Wook, et al., "150μm pitch Flipchip Packaging with Pb-free Solder and Cu/low-k Interconnects" 2004 Electronics Packaging Technology Conference pp. 126-130.

Shingubara, S. et al. "Bottom-up Fill of Copper in High Aspect Ratio Via Holes by Electrless Plating" IEEE, Mar. 2003, pp. 6.3.1-6.3.4.

* cited by examiner

METHODS OF FORMING ELECTRICALLY CONDUCTIVE STRUCTURES

TECHNICAL FIELD

Methods of forming electrically conductive structures.

BACKGROUND

Integrated circuit fabrication may include formation of conductive interconnects across various regions of a semiconductor substrate. Some of the interconnects may be formed in high aspect ratio openings associated with regions having high density of circuit devices, and others of the interconnects may be formed in low aspect ratio openings.

It may be desired to simultaneously form the conductive interconnects within both the low aspect ratio openings and the high aspect ratio openings. However, difficulties may be encountered in attempting such simultaneous formation of the conductive interconnects due to conductive material overfilling the high aspect ratio openings before the low aspect ratio openings are filled. FIGS. 1 and 2 illustrate the prior art problem.

Referring to FIG. 1, a portion of a semiconductor construction 10 is illustrated. The semiconductor construction includes a base 12 over which an insulative material 14 is formed.

The base 12 may comprise a semiconductor wafer. For instance, base 12 may comprise, consist essentially of, or consist of, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Base 12 is shown to be homogeneous in the illustration of FIG. 1 in order to simplify the drawing. The base may, however, comprise numerous different layers associated with integrated circuit fabrication. Such layers may, for example, comprise any of various conductive materials, insulative materials and semiconductor materials utilized in fabrication of various integrated circuit devices and interconnections.

Insulative material 14 may comprise any suitable composition or combination of compositions, and may, for example, comprise one or more of silicon dioxide, borophosphosilicate glass (BPSG), phosphosilicate glass (PSG), fluorosilicate glass (FSG), silicon nitride, silicon oxynitride, etc. Also, various conductive materials (not shown), may extend into insulative material 14 to electrically connect with other conductive materials formed over or through the insulative material.

Construction 10 is shown subdivided into two segments 16 and 18. Segment 16 comprises integrated circuit devices formed to high integration density, and may, for example, comprise a memory array. Segment 18 comprises integrated circuit devices formed to lower integration density, and may, for example, comprise logic devices.

Openings 20, 22, 24 and 26 extend into insulative material 14. The openings 20, 22 and 24 associated with segment 16 are formed to a higher aspect ratio than the opening 26 associated with segment 18.

An electrically conductive material 28 is formed over insulative material 14 and within openings 20, 22, 24 and 26. Material 28 may be a barrier material to prevent cross-diffusion between materials outside of openings 20, 22, 24 and 26, and other materials that will ultimately be formed within openings 20, 22, 24 and 26. For instance, if copper is ultimately to be formed within openings 20, 22, 24 and 26, then material 28 may be a barrier to copper diffusion, and may comprise, for example, one or more of tungsten, tantalum and tantalum nitride.

Referring to FIG. 2, conductive material 30 is formed within openings 20, 22, 24 and 26. Conductive material 30 may be formed in one or more plating steps, and may comprise, for example, one or more of copper, aluminum, ruthenium, tungsten, and other metals utilized in forming conductive interconnects. A problem with the formation of conductive material 30 is that high aspect ratio openings 20, 22 and 24 fill much faster than the low aspect ratio opening 26, and accordingly a large amount of overfill of conductive material 30 is formed over the high aspect ratio openings by the time that the low aspect ratio opening is filled. The excess material 30 may be removed by planarization (for instance, chemical-mechanical polishing (CMP)). However, the large amount of excess material 30 may create complications for the planarization which lead to dishing or other defects. Additionally, the large amount of excess material 30 leads to significant waste of the material 30, as well as to costs associated with removal and waste management.

It would be desirable to develop new methods which could alleviate or eliminate some or all of the above-discussed problems associated with prior art methods of simultaneously forming conductive materials within low aspect ratio openings and high aspect ratio openings.

BRIEF DESCRIPTION OF THE DRAWINGS

FIG. 3 shows the semiconductor construction at a process stage subsequent to the prior art process stage of FIG. 1.

FIG. 8 shows the semiconductor construction at a process stage subsequent to the process stage of FIG. 4.

DETAILED DESCRIPTION OF THE ILLUSTRATED EMBODIMENTS

In some embodiments, selective plating is utilized to avoid the prior art problems discussed above in the "background"

section of this disclosure. Specifically, high aspect ratio openings are first filled with conductive material while only partially filling low aspect ratio openings, and then conductive material is formed within a remaining portion of the low aspect ratio openings by one or more selective plating processes to avoid forming large bumps of conductive material over the already-filled high aspect ratio openings.

Example embodiments are described with reference to FIGS. 3-13. FIGS. 3-9 illustrate portions of a semiconductor wafer being treated, and FIGS. 10-13 illustrate example apparatuses that may be utilized for some of the treating processes. FIGS. 3-9 will be described utilizing numbering identical to that utilized for describing the prior art of FIGS. 1 and 2, where appropriate.

Figure 1:
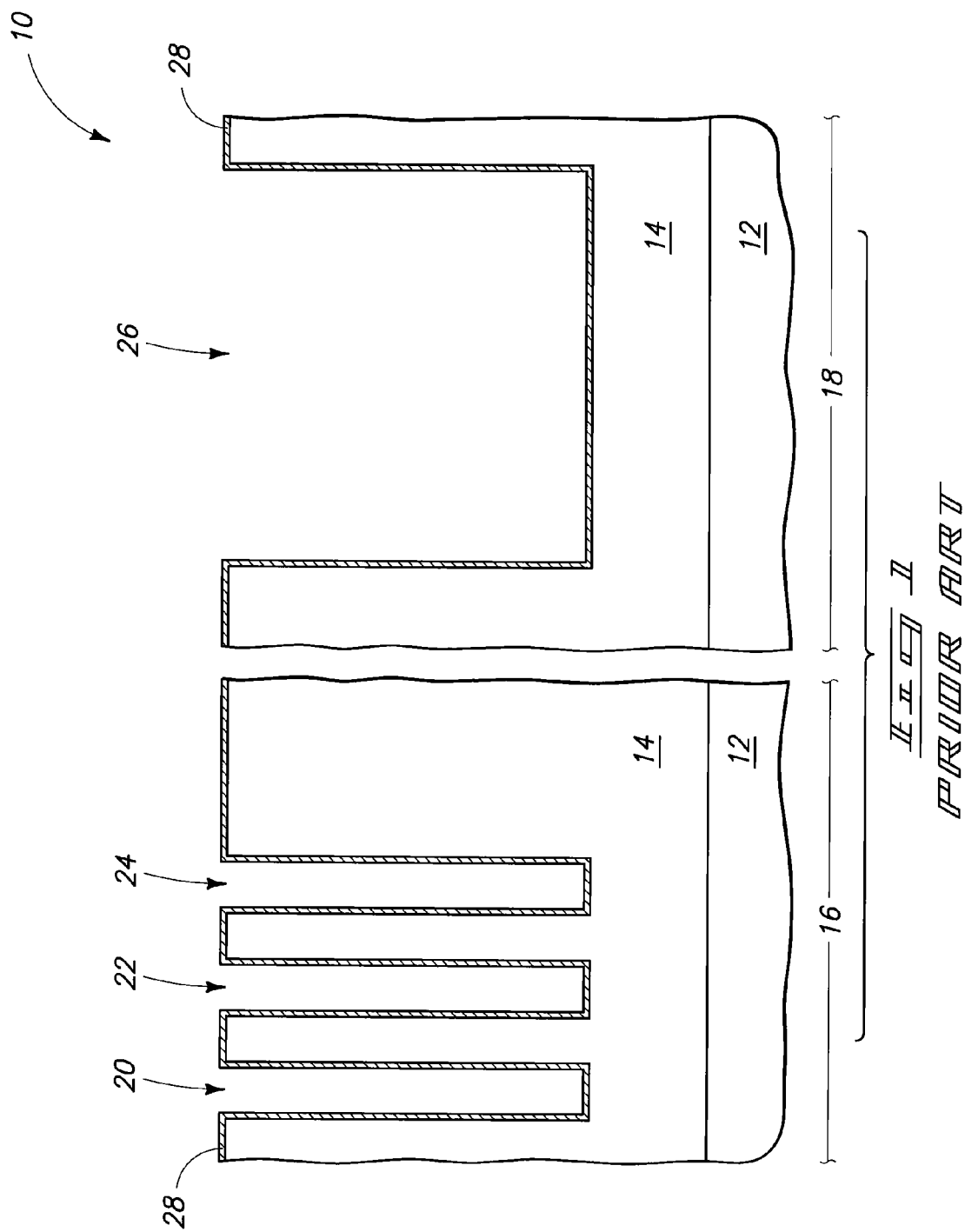
FIGS. 1 and 2 illustrate portions of a semiconductor construction at process stages of a prior art method of forming conductive material within high aspect ratio openings and low aspect ratio openings.
Figure 2:
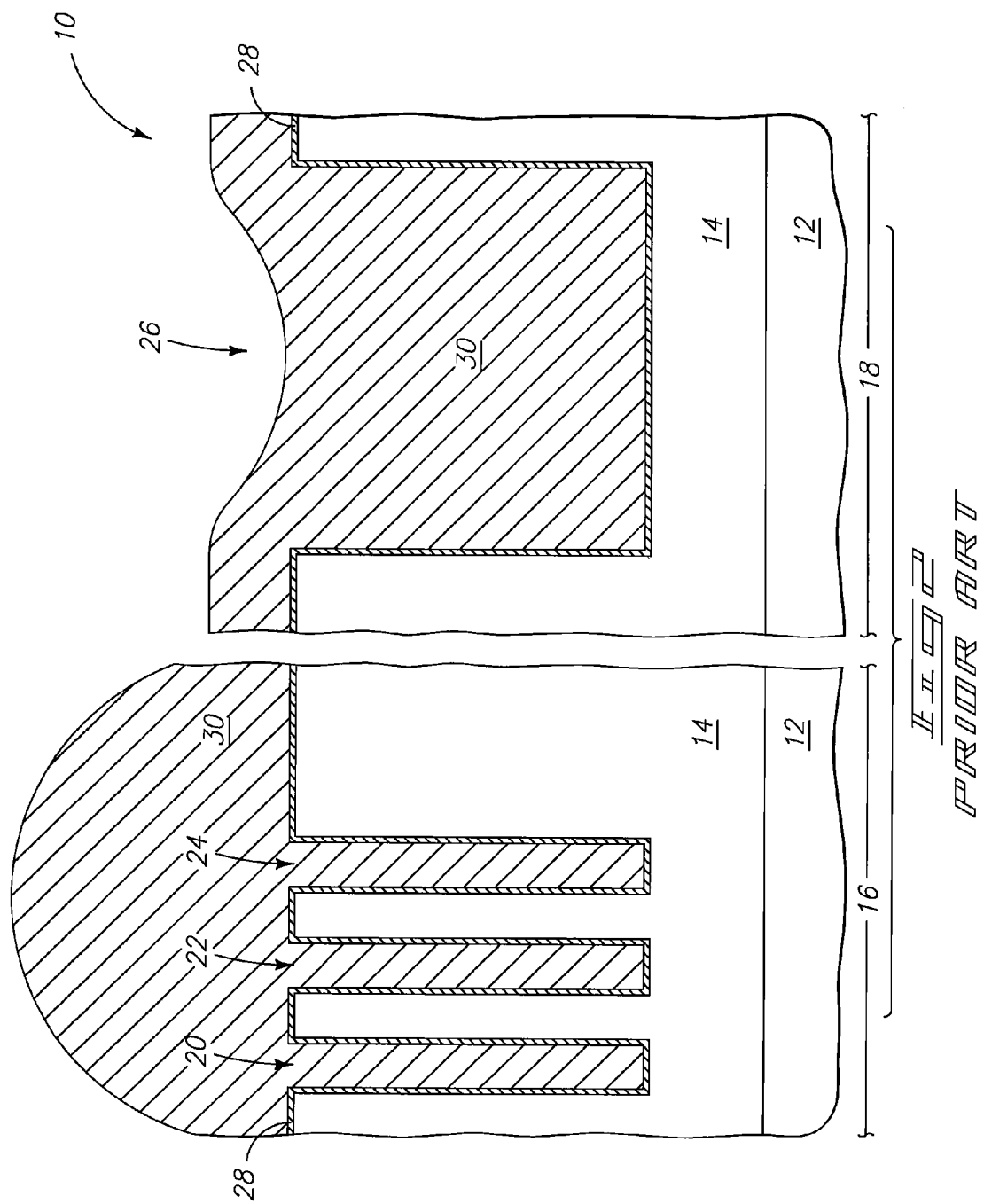
Figure 3:
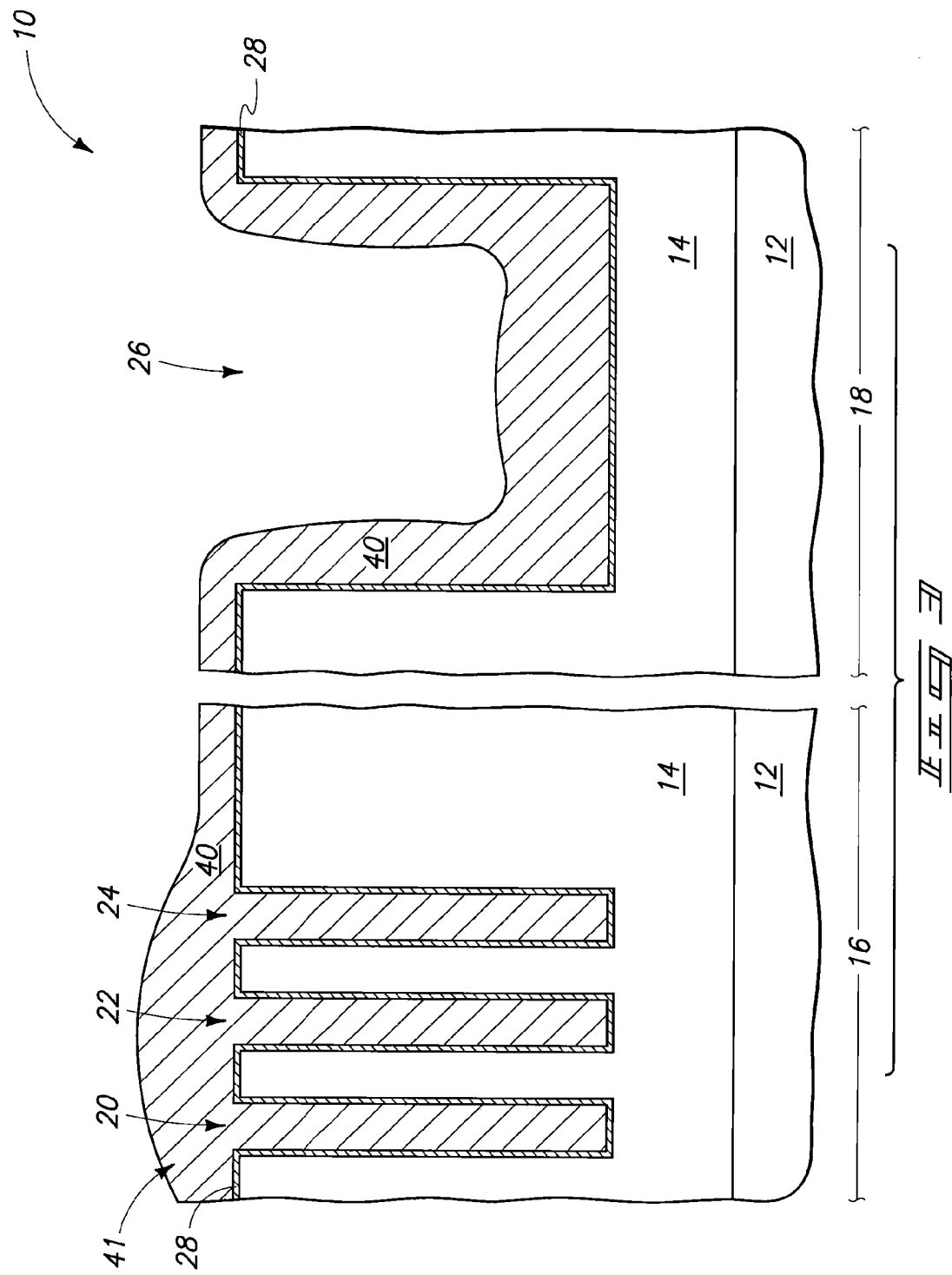
FIGS. 3-7 illustrate portions of a semiconductor construction at process stages of an embodiment which may be utilized for forming conductive material within high aspect ratio openings and low aspect ratio openings.

Referring to FIG. 3, construction 10 is shown at a processing stage subsequent to that of prior art FIG. 1. The construction 10 of FIG. 3 comprises the substrate 12 and insulative material 14 subdivided amongst the segments 16 and 18 discussed above. The construction also comprises the high aspect ratio openings 20, 22 and 24 extending into insulative material 14 within segment 16, and comprises the low aspect ratio opening 26 extending into insulative material 14 within segment 18. Additionally, the construction comprises the barrier material 28 extending within openings 20, 22, 24 and 26, and over an upper surface of insulative material 14.

The openings 20, 22, 24 and 26 may be considered to be subdivided amongst two sets. One of the sets comprises the openings 20, 22 and 24 having the high aspect ratio, and the other of the sets comprises the opening 26 having the low aspect ratio. The terms "high aspect ratio" and "low aspect ratio" are utilized relative to one another, with the openings having the "high aspect ratio" being understood to have a greater aspect ratio than the openings having the "low aspect ratio". In some embodiments, the openings having the high aspect ratio may have a maximal cross-sectional width of less than or equal to about 100 nanometers (for instance, less than or equal to about 50 nanometers), while having a depth of at least about 1000 angstroms (and in some embodiments at least about 3000 angstroms); and the opening having the low aspect ratio may have a maximal cross-sectional width of at least about 50 micrometers (for instance, at least about 60 micrometers) and the depth of at least about 1000 angstroms (and in some embodiments at least about 3000 angstroms). The number of high aspect ratio openings and low aspect ratio openings may vary depending on the application.

A conductive material 40 is formed across material 28 and within the openings 20, 22, 24 and 26. Conductive material 40 fills the high aspect ratio openings 20, 22 and 24, and only partially fills the low aspect ratio opening 26. Conductive material 40 may, for example, comprise one or more metals selected from the group consisting of copper, aluminum, ruthenium and tungsten; and may be formed by any suitable method including, for example, one or more of electrolytic plating, electroless plating, atomic layer deposition (ALD), chemical vapor deposition (CVD), spin-on methodologies, and supercritical fluid assisted deposition methodologies. In the shown embodiment, conductive material 40 overfills the high aspect ratio openings to form a bump 41 over the high aspect ratio openings.

Figure 4:
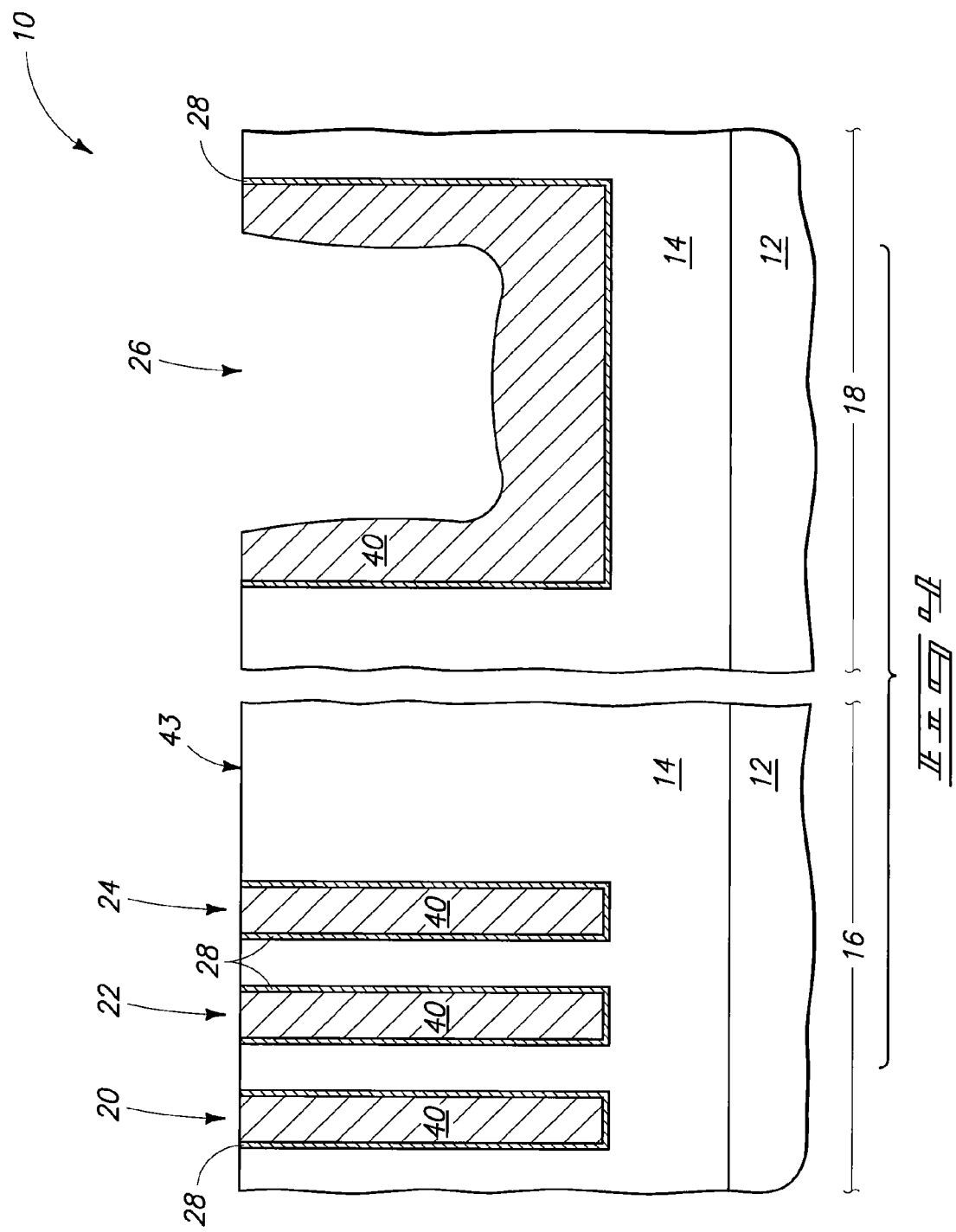

Referring to FIG. 4, conductive material 40 is removed from over an upper surface of insulative material 14 by planarization (for instance, CMP). The planarization also removes conductive material 28 from over the upper surface of insulative material 14, and forms a planarized surface 43 extending across the insulative material 14, conductive material 40 and conductive material 28 of the high aspect ratio openings 20, 22, and 24.

Figure 5:
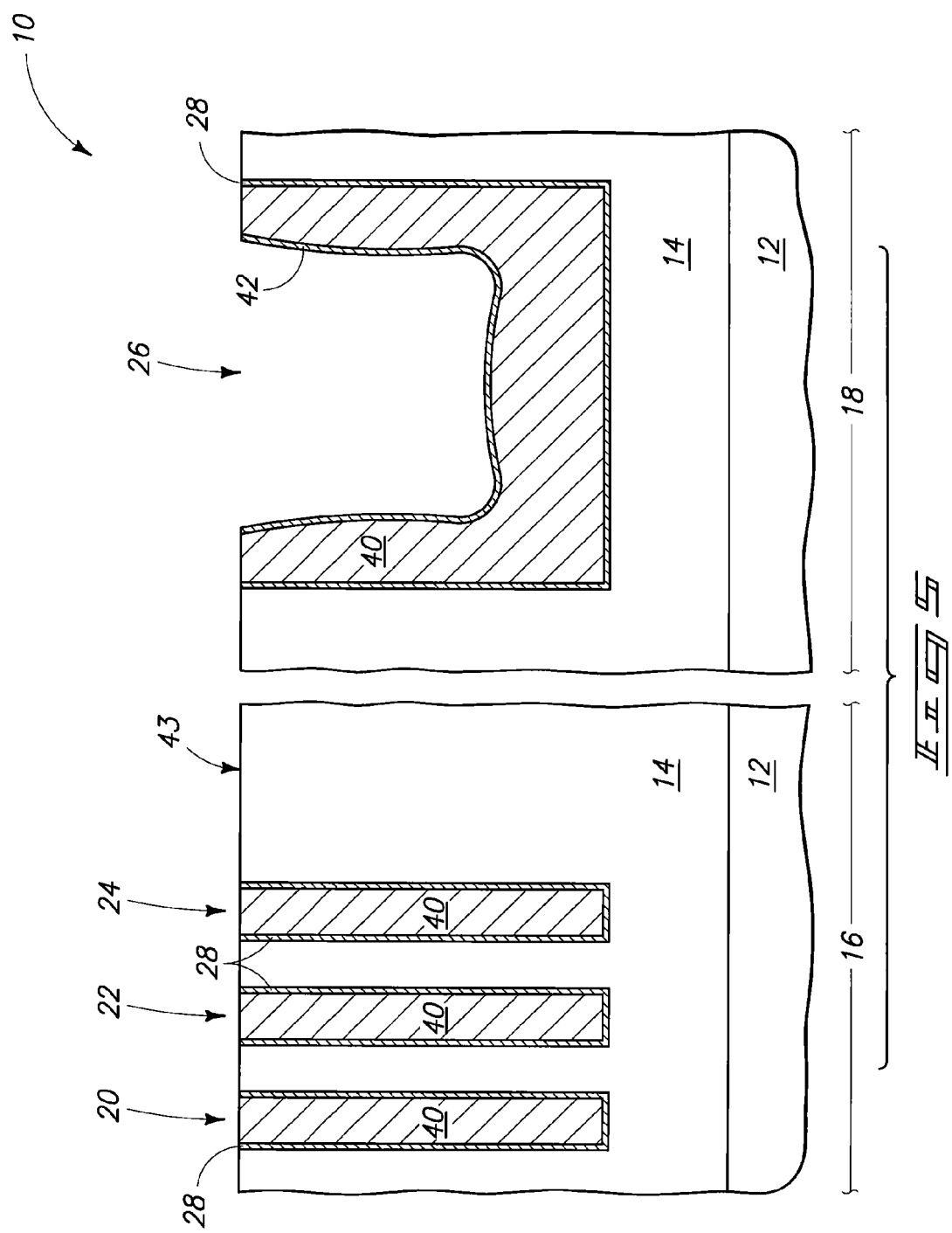

Referring to FIG. 5, a conductive material 42 is formed within the low aspect ratio opening 26 and not across the planarized surface 43. Conductive material 42 is thus selectively formed over the conductive material 40 within opening 26, relative to the conductive material 40 exposed along planarized surface 43. Such selective formation may be accomplished utilizing electroless plating under conditions which favor formation of conductive material 42 within an opening rather than over a planarized surface.

Figure 10:
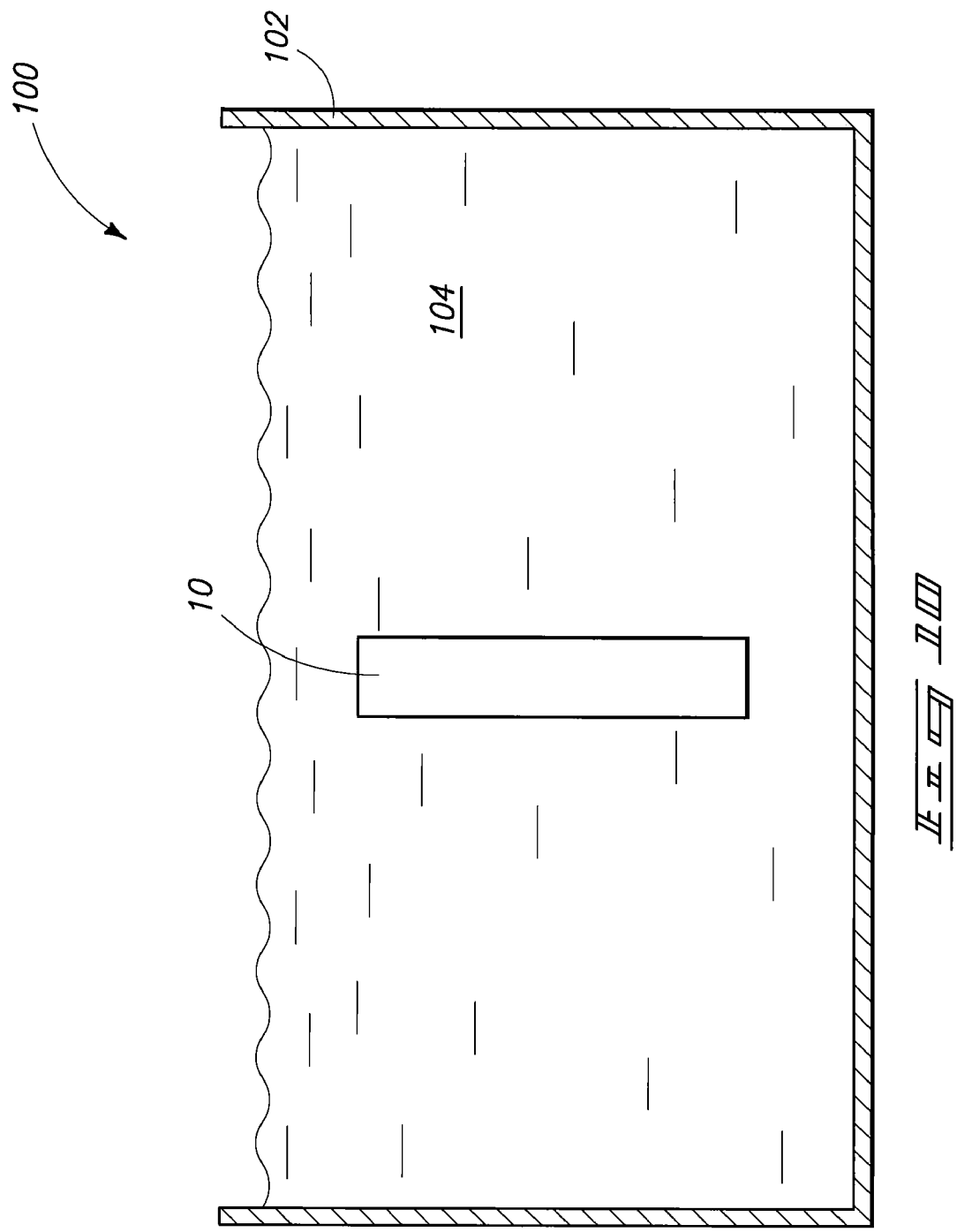
FIG. 10 is a cross-sectional, diagrammatic view of apparatus that may be utilized for treating a semiconductor construction in some embodiments.

In some embodiments, material 42 may be formed utilizing a plating bath having stabilizers therein which favor formation of the material 42 within the opening 26 rather than over surface 43. FIG. 10 diagrammatically illustrates an apparatus 100 comprising a vessel 102 retaining a plating bath 104 therein. A construction 10 is shown suspended within the plating bath. The construction 10 may be supported by various conventional support structures (not shown). The plating bath may be of a suitable composition to electroless plate a conductive layer comprising one or more of cobalt, nickel and palladium across a surface of conductive material 40, and may contain stabilizers that enhance formation of the conductive layer within a low aspect ratio opening rather than across a planar surface. Such stabilizers may, for example, include thorium-containing compounds and/or lead-containing compounds, with an example lead-containing compound being lead acetate; and may be utilized in accordance with procedures described by Pactech, LLC, and Fraunhofer Institut Zuverlassigkeit und Milrointegration (IZM).

Figure 11:
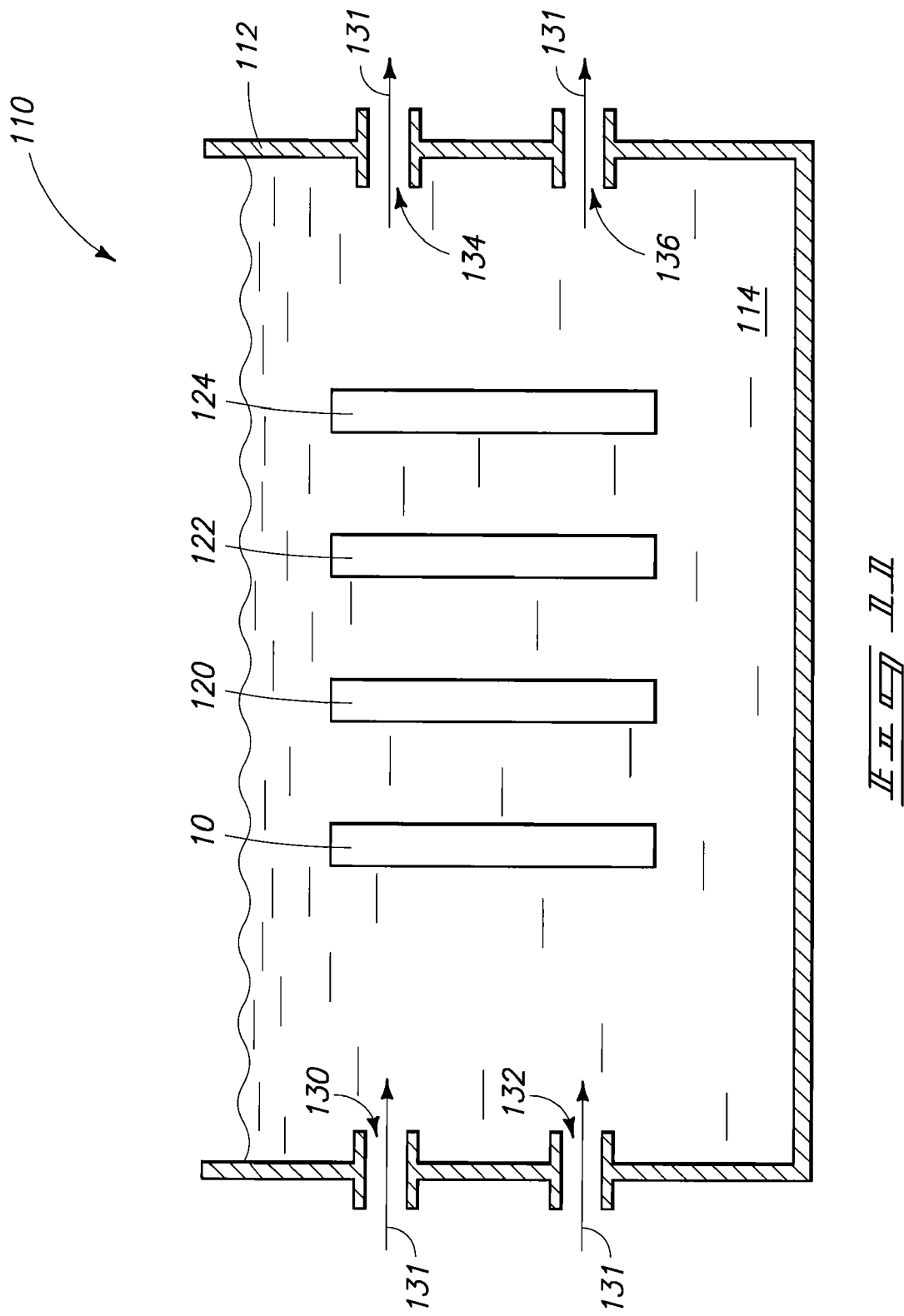
FIG. 11 is a cross-sectional, diagrammatic view of an apparatus that may be utilized for treating a semiconductor construction in some embodiments.

In some embodiments, conductive material 42 (FIG. 5) is selectively formed within opening 26, and not over planarized surface 43, utilizing electroless plating under conditions of high turbulence. FIG. 11 shows an example apparatus 110 that may be utilized for treating a batch of semiconductor substrates under conditions of high turbulence flow. The apparatus 110 comprises a vessel 112 retaining a plating bath 114. A plurality of substrates 10, 120, 122 and 124 are shown suspended within the plating bath 114. The substrates may be suspended with one or more conventional support structures (not shown).

A plurality of ports 130, 132, 134 and 136 extend through vessel 112, and fluid of the plating bath is shown flowed through the ports by arrows 131. In the shown embodiment, ports 130 and 132 are inlet ports (specifically, the plating bath fluid flows into vessel 112 through the ports 130 and 132), and ports 134 and 136 are outlet ports (specifically, the plating bath fluid flows out of vessel 112 through the ports 134 and 136).

A rate of fluid flow through vessel 112 determines turbulence across surfaces of substrates 10, 120, 122 and 124. If there is sufficient turbulence, plating will occur primarily, or even entirely, within the protected interiors of the low aspect ratio openings, rather than across the planar surfaces extending across the high aspect ratio openings.

Figure 12:
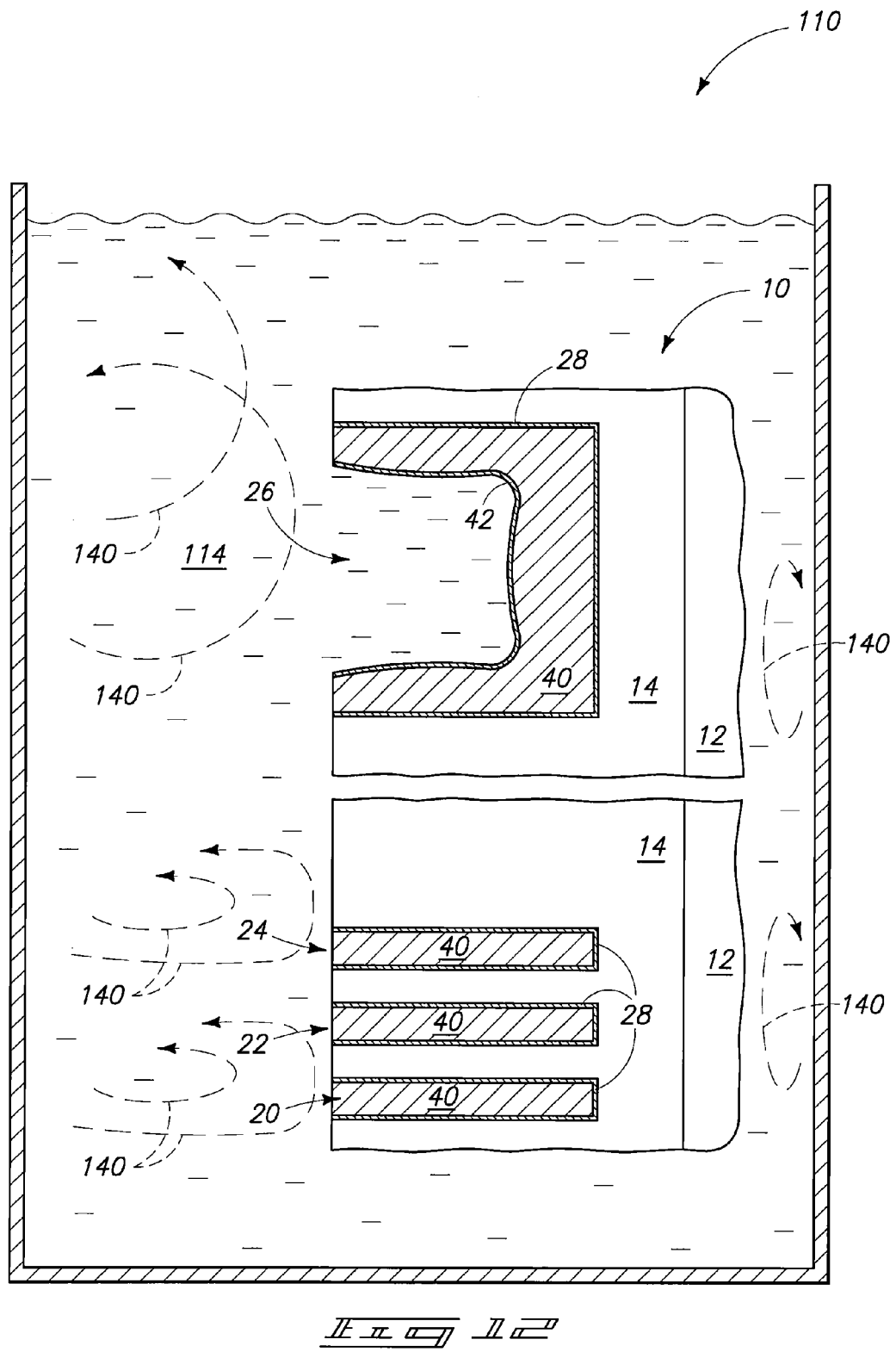
FIG. 12 is a diagrammatic, cross-sectional view of a portion of a semiconductor construction being treated in accordance with an embodiment.

FIG. 12 diagrammatically illustrates a portion of a semiconductor construction 10 within a plating bath 114 as the turbulent flow of the plating bath fluid swirls within the bath. Such turbulent flow is diagrammatically illustrated by arrows 140. The construction 10 of FIG. 12 is identical to the construction shown in FIG. 5. FIG. 12 diagrammatically shows the turbulent flow disrupting deposition of material across the planar surface 43, and shows opening 26 corresponding to a quiet harbor or bay which shields the conductive material 40 therein from the turbulent flow, and accordingly enables plating of material 42 to occur across the surface of the conductive material 40 within opening 26.

The selective deposition of material 42 within protected openings relative to across planar surfaces may be enhanced by utilizing deposition conditions that are relatively slow. Thus, the concentration of plating materials within bath 114 may be maintained to be relatively low, and/or a temperature of the plating bath may be relatively low. For instance, conventional electroless plating is often conducted at temperatures of at least about 80° C. In contrast, some embodiments of the present invention may utilize an electroless plating bath maintained at a temperature of less than 50° C. (for instance, at from about 40° C. to about 50° C.) while maintaining the turbulent flow within the bath.

The apparatus of FIG. 11 is shown configured for treating a batch of semiconductor substrate simultaneously. In other embodiments, the apparatus may be configured for treating a single semiconductor substrate.

Figure 13:
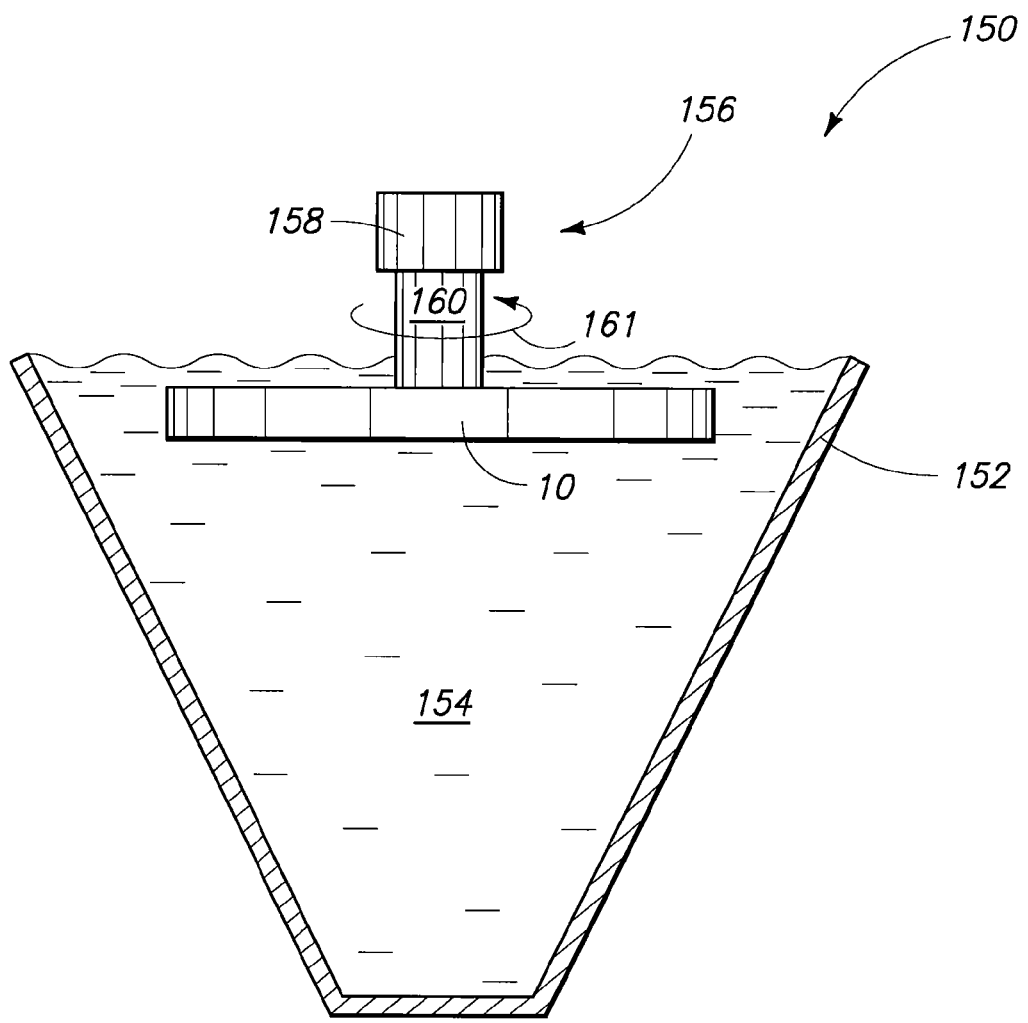
FIG. 13 is a cross-sectional, diagrammatic view of an apparatus that may be utilized for treating a semiconductor construction in some embodiments.

Another type of apparatus that may be utilized for exposing a semiconductor substrate to turbulent flow within a plating bath is shown in FIG. 13 as an apparatus 150. Such apparatus comprises a vessel 152 retaining a plating bath 154. A semiconductor substrate 10 is shown suspended in the bath, with the substrate being supported by a mechanism 156. The mechanism includes a motor 158, connected to a chuck 160, which in turn is connected to substrate 10. The substrate may be retained on the chuck with clips or other conventional retaining mechanisms (not shown), and may be retained so that the substrate is upside down in bath 154 relative to the orientation shown in FIG. 5. The motor is configured to spin the chuck, as is diagrammatically illustrated by arrow 161. A rate at which the substrate is spun will determine turbulence along a surface of the substrate. Accordingly, the substrate may be spun during plating of material 42 (FIG. 5) across the substrate.

In some embodiments, conductive material 42 (FIG. 5) is selectively formed within opening 26, and not over planarized surface 43, utilizing electroless plating under conditions of high turbulence as discussed with reference to FIGS. 11-13, in combination with the stabilizers discussed with reference to FIG. 10.

In some embodiments, the material 42 deposited at the processing stage of FIG. 5 may be an activation material which a suitable for subsequent electroless deposition of conductive material thereover. Such activation material may be any suitable material, and may, for example, comprise, consist essentially of, or consist of one or more metals selected from the group consisting of cobalt, nickel and palladium.

Figure 6:
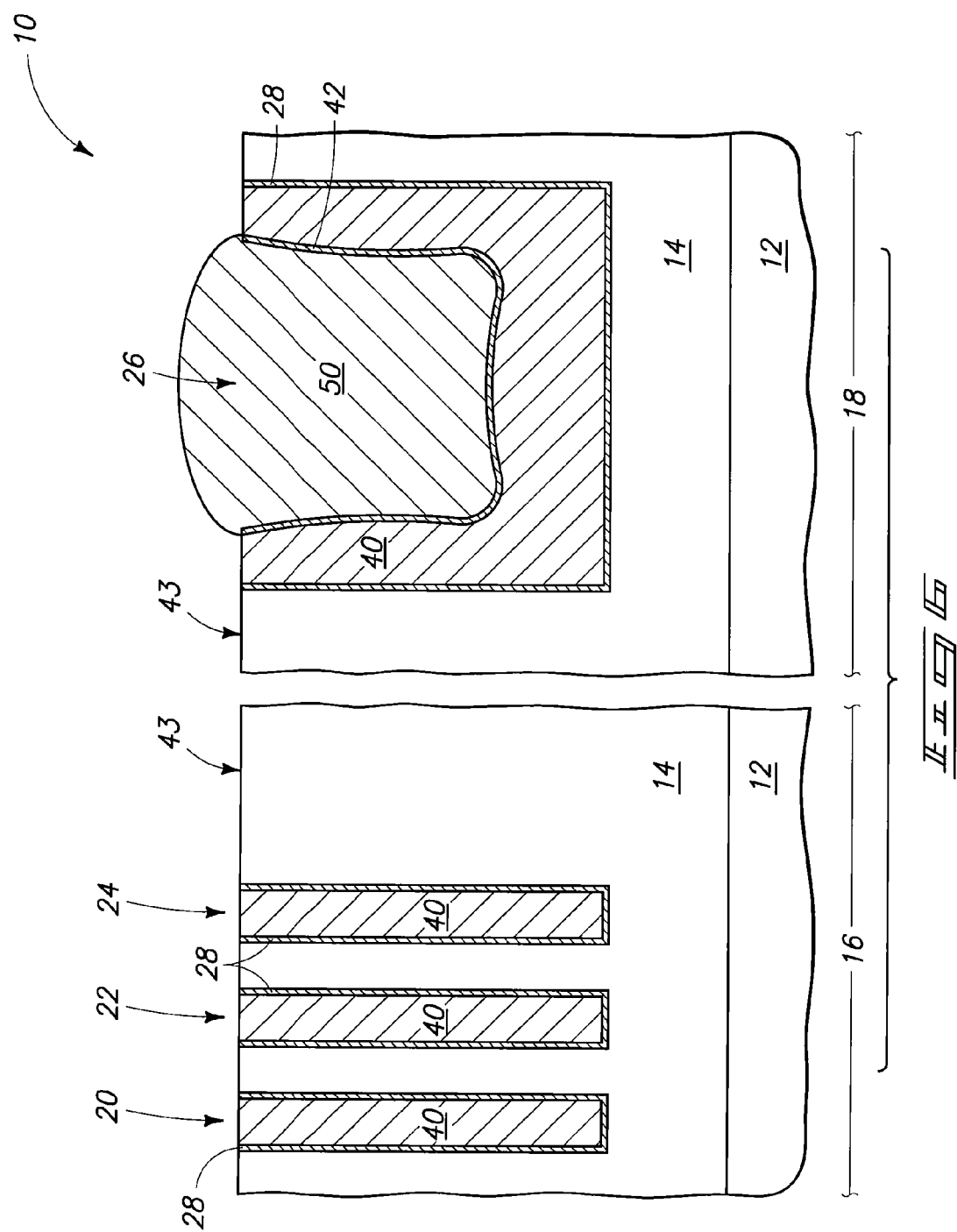

Referring to FIG. 6, a conductive material 50 is selectively plated onto activation material 42. Such selective plating may comprise electroless deposition, and may comprise conventional methods for selectively plating onto activated surfaces versus non-activated surfaces. Material 50 may comprise, consist essentially of, or consist of one or more metals selected from the group consisting of copper, aluminum, ruthenium and tungsten. In some embodiments, material 50 may comprise a same composition as material 40, and in other embodiments material 50 may comprise a different composition from material 40. In some embodiments, materials 40 and 50 may be referred to as first and second conductive materials, respectively.

Material 50 is shown to overfill opening 26. In subsequent processing, construction 10 may be subjected to planarization to extend planarized surface 43 across the conductive material 50 within opening 26, to achieve the structure shown in FIG. 7.

Although the growth of material 50 is shown to be 100 percent selective for growth over activation material 42 relative to growth over conductive materials 40 and 28 within the high aspect ratio openings 20, 22 and 24, in other embodiments the selectivity may be less so that there is some growth of material 50 over high aspect ratio openings 20, 22 and 24. Regardless, planarization of construction 10 may lead to the structure of FIG. 7.

The processing of FIGS. 3-7 provides less deposition of conductive material across an upper surface of construction 10 than did the prior art deposition described above with reference to FIG. 2, and accordingly leads to less waste of conductive material. The processing of FIGS. 3-7 may also alleviate, or eliminate, some of the other problems discussed above in the "background" section of this disclosure.

Figure 7:
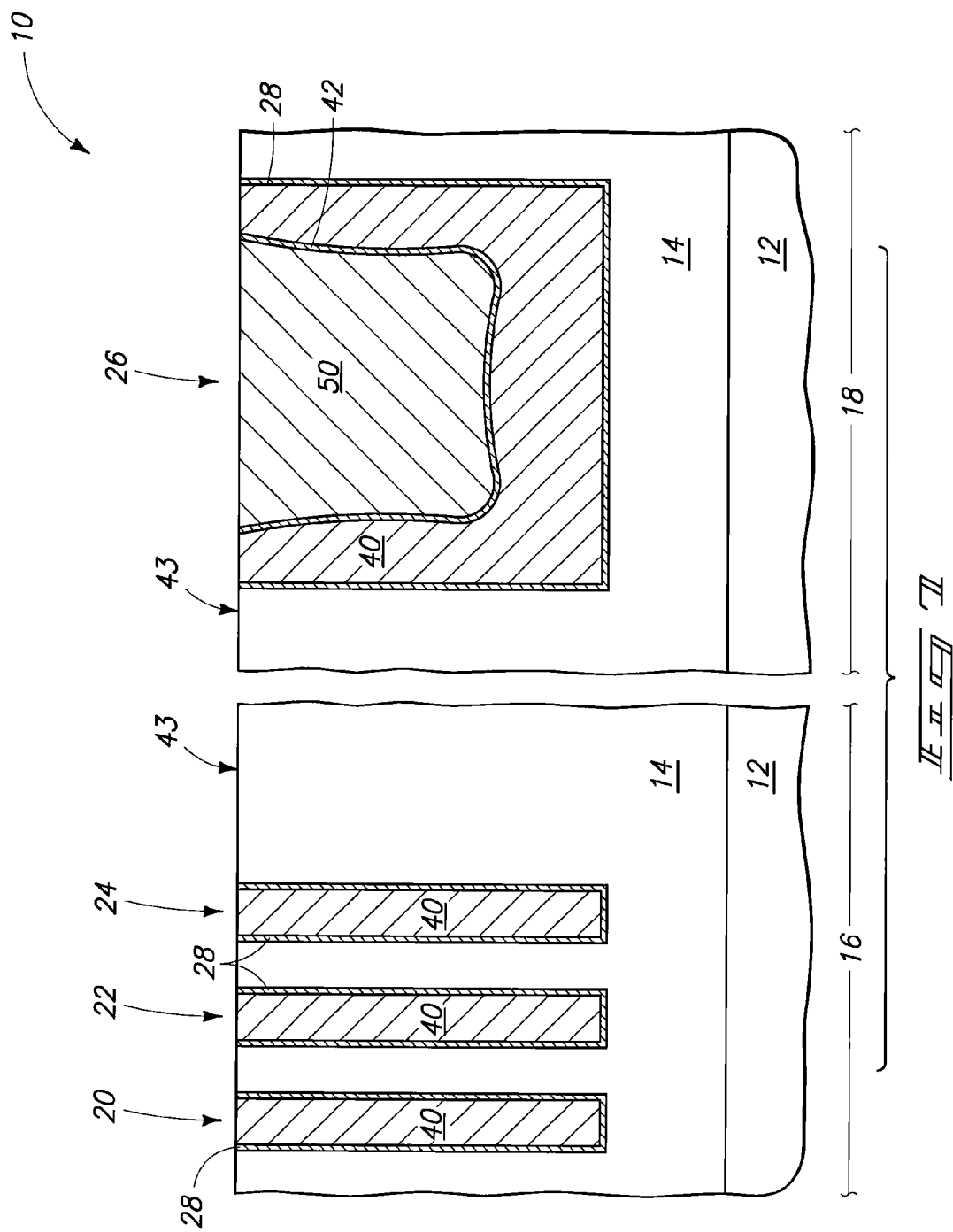

The processing of FIGS. 5-7 includes selective formation of activation material 42 within opening 26. In other embodiments, selective plating technologies may be utilized to fill opening 26 without formation of the activation material therein. An example embodiment is described with reference to FIGS. 8 and 9.

Figure 8:
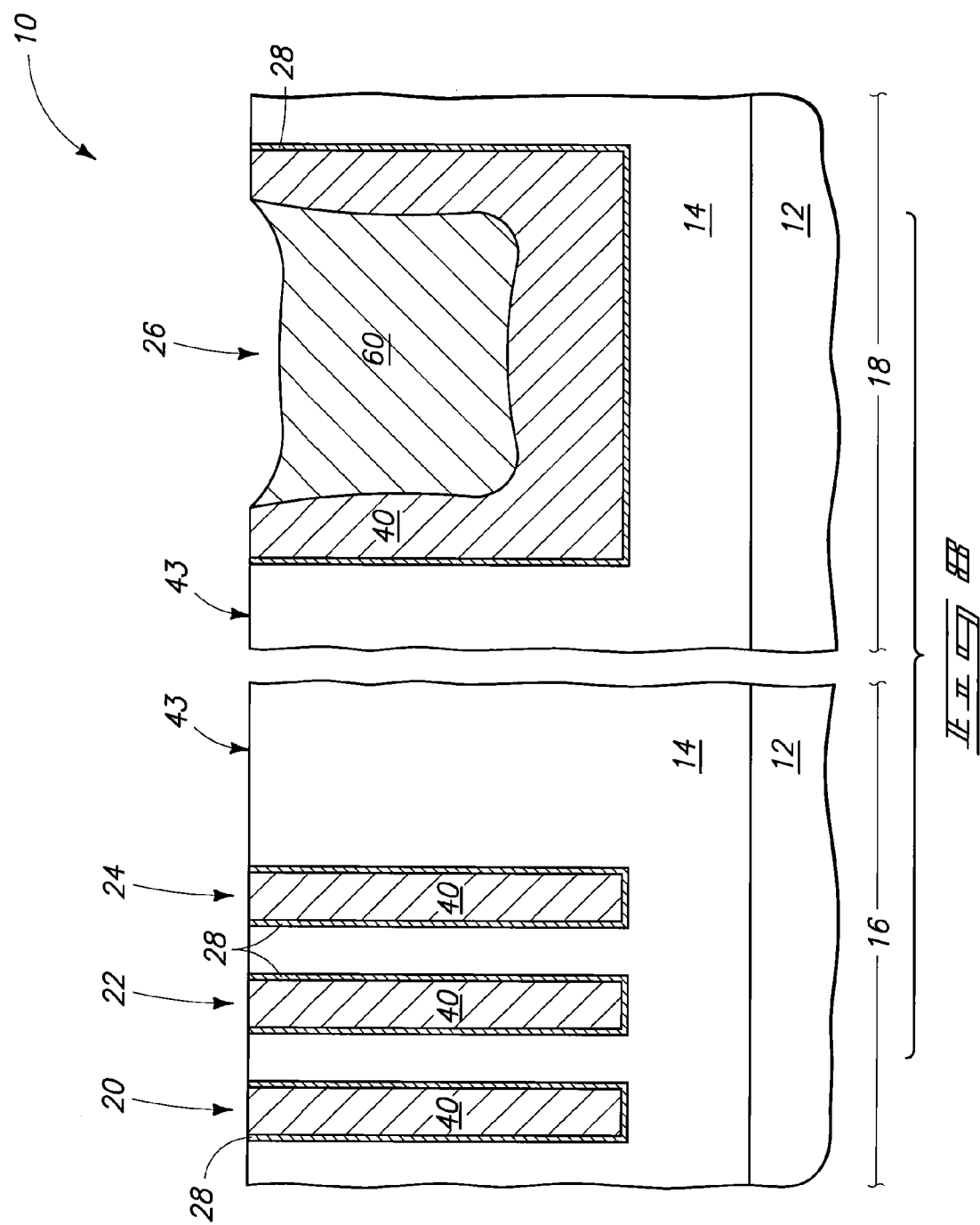
FIGS. 8 and 9 illustrate a portion of a semiconductor construction at process stages of another embodiment which may be utilized for forming conductive material within high aspect ratio openings and low aspect ratio openings.

FIG. 8 shows construction 10 at a processing stage subsequent to that of FIG. 4. A conductive material 60 is selectively formed within opening 26 to fill the opening. The selective formation of conductive material 60 may comprise utilization of various of the turbulent flow conditions discussed previously with reference to FIGS. 11-13. The material 60 may comprise any suitable plate-able conductive material, and may, for example, comprise one or more of the activation materials of cobalt, nickel and palladium discussed above; and/or may comprise any the materials copper, aluminum, ruthenium and tungsten discussed above. Accordingly, in some embodiments turbulent flow may be utilized for selectively plating within a low aspect ratio opening relative to a planarized surface, and may be conducted for a sufficient duration to fill a substantial portion (for instance, more than half of the volume) of the low aspect ratio opening.

In some embodiments, conductive materials 40 and 60 may be referred to as first and second conductive materials, respectively. Conductive materials 40 and 60 may comprise the same composition as one another in some embodiments, and may comprise different compositions from one another in other embodiments.

Figure 9:
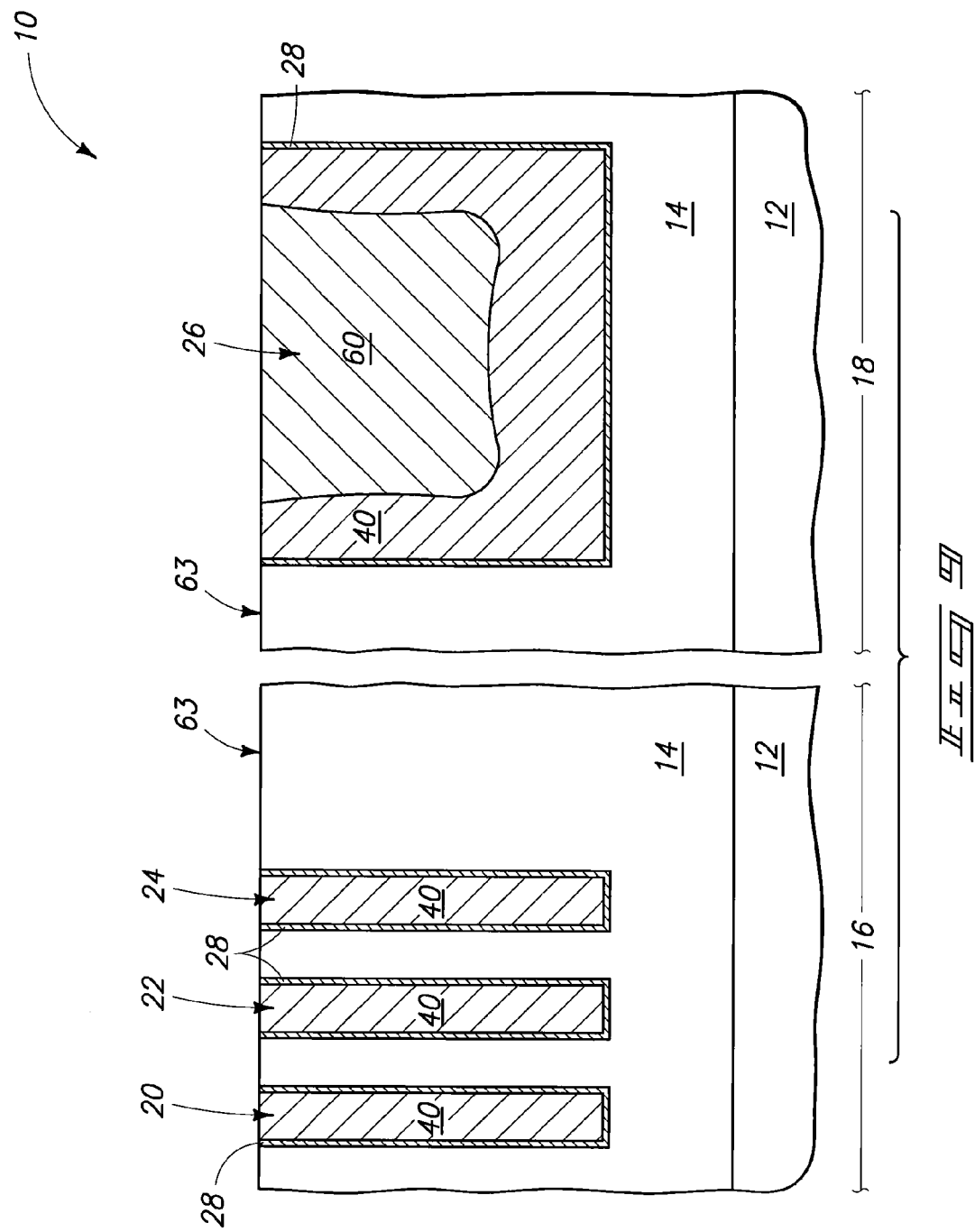

The construction 10 of FIG. 8 shows a material 60 formed to a level which underfills opening 26. In subsequent processing, construction 10 may be subjected to planarization to form a new planarized surface 63 that extends across segments 16 and 18 of the construction, as shown in FIG. 9.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming electrically conductive structures, comprising:
   forming two sets of openings over a semiconductor substrate, a first of the two sets having a greater aspect ratio than a second of the two sets;
   overfilling the first set of the openings with a first conductive material while only partially filling the second set of the openings with the first conductive material;
   planarizing a surface of the first conductive material within the first set of openings;
   after the planarizing, exposing the substrate to plating conditions that selectively deposit activation material over the first conductive material within the second set of the openings while leaving the first conductive material exposed within the first set of the openings; and selectively forming second conductive material on the activation material relative to the exposed first conductive material.

2. The method of claim 1 wherein the plating conditions utilize one or more stabilizers that comprise one or both of thorium and lead.

3. The method of claim 1 wherein the plating conditions comprise exposing the substrate to turbulent flow in a bath.

4. The method of claim 1 wherein:

the plating conditions utilize one or more stabilizers that comprise one or both of thorium and lead; and the plating conditions comprise exposing the substrate to turbulent flow in a bath.

5. A method of forming electrically conductive structures, comprising:

forming two sets of openings over a semiconductor substrate, a first of the two sets having a greater aspect ratio than a second of the two sets;

overfilling the first set of the openings with a first conductive material while only partially filling the second set of the openings with the first conductive material;

planarizing a surface of the first conductive material within the first set of openings; and after the planarizing, exposing the substrate to turbulent flow within a plating bath to deposit activation material over the first conductive material within the second set of the openings faster than any deposition of the activation material over the first conductive material within the first set of the openings.

6. The method of claim 5 wherein the exposing the substrate to the turbulent flow comprises spinning the substrate within the plating bath.

7. The method of claim 5 wherein the exposing the substrate to the turbulent flow comprises flow of liquid through the plating bath, and wherein the substrate is one of a plurality of substrates that are simultaneously exposed to the turbulent flow within the plating bath.

8. A method of forming electrically conductive structures, comprising:

forming two sets of openings over a semiconductor substrate, a first of the two sets having a greater aspect ratio than a second of the two sets;

filling the first set of the openings with a first conductive material while only partially filling the second set of the openings with the first conductive material;

exposing the substrate to a temperature less than about 50° C. within a plating bath, and to turbulent flow within the plating bath, to selectively deposit activation material over the first conductive material within the second set of the openings while leaving the first conductive material exposed within the first set of the openings; and selectively plating second conductive material on the activation material relative to the exposed first conductive material.

9. The method of claim 8 wherein the exposing the substrate to the turbulent flow comprises spinning the substrate within the plating bath.

10. The method of claim 8 wherein the exposing the substrate to the turbulent flow comprises flow of liquid through the plating bath.

11. The method of claim 8 wherein the substrate is one of a plurality of substrates that are simultaneously exposed to the temperature and turbulent flow within the plating bath.

12. The method of claim 8 wherein the temperature is from about 40° C. to about 50° C.

* * * * *